United States Patent
Preston et al.

(10) Patent No.: US 6,187,611 B1
(45) Date of Patent: Feb. 13, 2001

(54) MONOLITHIC SURFACE MOUNT SEMICONDUCTOR DEVICE AND METHOD FOR FABRICATING SAME

(75) Inventors: Robert J. Preston, Windham; Charles D. Gagne, Manchester, both of NH (US)

(73) Assignee: Microsemi Microwave Products, Inc., Lowell, MA (US)

(*) Notice: Under 35 U.S.C. 154(b), the term of this patent shall be extended for 0 days.

(21) Appl. No.: 09/177,638

(22) Filed: Oct. 23, 1998

(51) Int. Cl.[7] ............................ H01L 21/44; H01L 21/48; H01L 21/50
(52) U.S. Cl. ............................................. 438/106; 438/118
(58) Field of Search ..................................... 438/106, 116, 438/118, 127

(56) References Cited

U.S. PATENT DOCUMENTS

| | | | |
|---|---|---|---|
| 4,794,092 | * 12/1988 | Solomon | 438/109 |
| 5,557,149 | * 9/1996 | Richards et al. | 257/779 |
| 5,910,687 | * 6/1999 | Chen et al. | 257/784 |

FOREIGN PATENT DOCUMENTS

| | | |
|---|---|---|
| WO 95/19645 | 7/1995 | (WO) . |
| WO 96/02071 | 1/1996 | (WO) . |
| WO 97/47040 | 12/1997 | (WO) . |

* cited by examiner

Primary Examiner—Richard Elms
Assistant Examiner—Christian D. Wilson
(74) Attorney, Agent, or Firm—Hoffmann & Baron, LLP

(57) ABSTRACT

A monolithic surface mount semiconductor device includes at least one discrete device formed on an active surface of a semiconductor substrate. An insulative layer is bonded to the active surface of the substrate, preferably by depositing an encapsulant epoxy between the active surface and the insulative layer, the epoxy forming a mechanical bond between the insulative layer and the active surface of the substrate. A plurality of contacts are formed, preferably on a back surface of the substrate, opposite the active surface. The contacts provide electrical connection to the integrated circuit, transistor, and/or diode. The insulative layer, in combination with the discrete device(s), forms a complete surface mount semiconductor device having a package that is monolithically fabricated with the discrete device(s) at the wafer level.

4 Claims, 12 Drawing Sheets

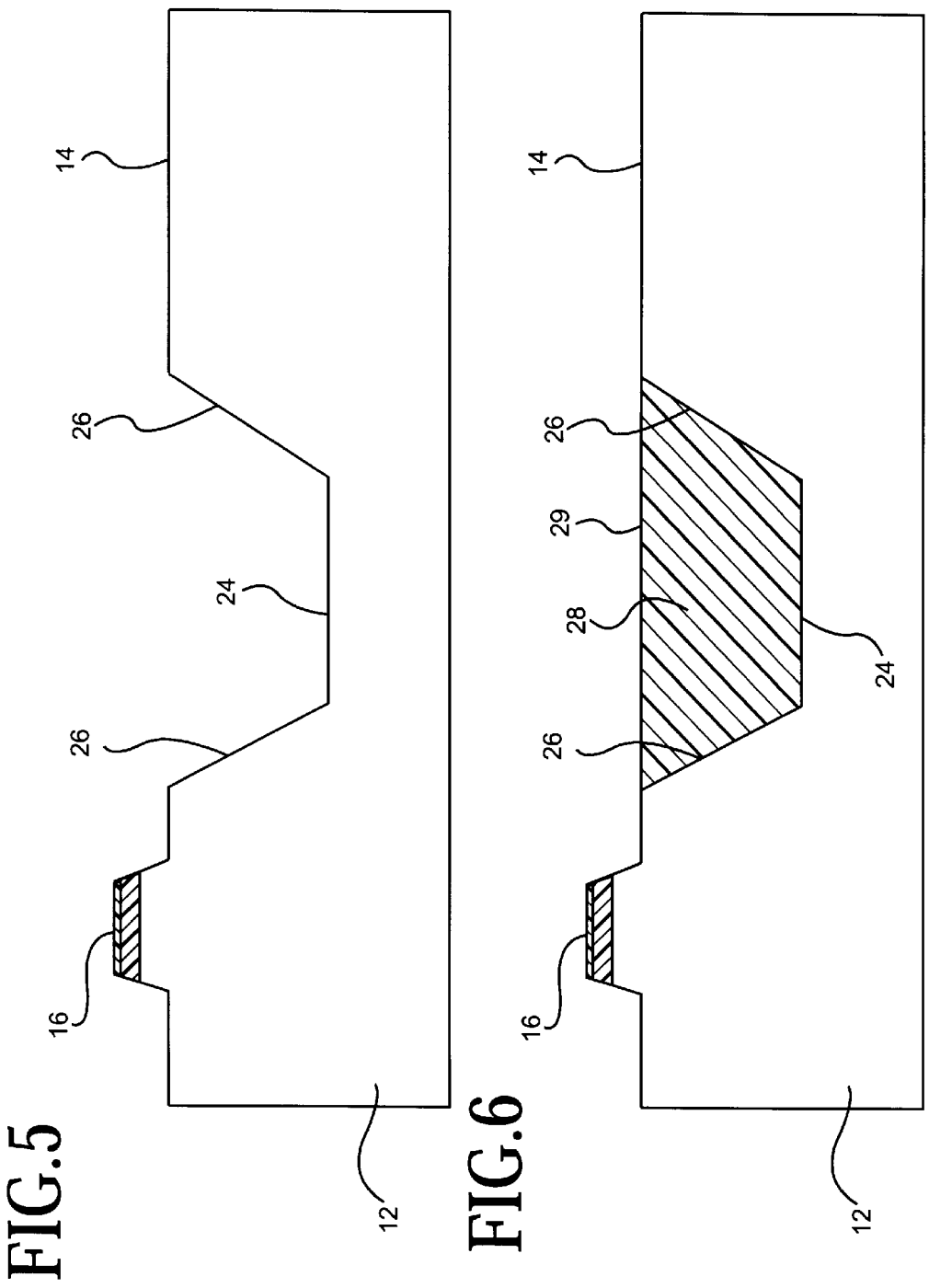

MONOLITHIC SURFACE MOUNT SEMICONDUCTOR DEVICE AND METHOD FOR FABRICATING SAME

BACKGROUND OF THE INVENTION

1. Field of the Invention

The present invention relates generally to semiconductor devices, and more particularly to a monolithic surface mount semiconductor device and fabrication method.

2. Description of the Prior Art

Some of the main issues driving component packaging today include thermal and electrical performance, real estate constraints (i.e., package size) and manufacturing cost. With integrated circuit (IC) geometries shrinking well into the sub-micron level, and operating frequencies in the gigahertz range, attention has focused on the evolution of advanced packaging technologies to address the numerous issues now plaguing diode, transistor and IC designers. Ranging from thermal problems, to parasitic interference, to inductive losses, these issues have created a technological bottleneck which has made packaging technology a crucial concern.

One of the basic limitations of semiconductor devices is the dissipation of heat generated during operation of the device. This heat must be transferred to some thermal sink without causing excessive temperature rise within the device. Such excessive temperatures can cause partial or total device failure, and generally degrades the overall reliability of the device. The ability to dissipate heat places an upper bound on the maximum allowable power dissipation or ambient temperature range of operation of the device.

Where speed or power dissipation is not an issue, conventional plastic packages (e.g., dual-in-line package, surface mount, etc.), which are typically non-hermetic and made of injection-molded epoxy compounds, are employed in the semiconductor industry due to their low cost. Plastic packages, however, inherently have higher parasitic capacitance and lower thermal conductivity, compared to other package types. Furthermore, conventional plastic package performance falls off or becomes widely erratic at higher frequencies (typically exceeding 1 gigahertz) due, at least in part, to variations in package parasitics (i.e., parasitic capacitance and inductance) from device to device. These and other disadvantages make standard plastic packages unsuitable for applications requiring high speed and high power dissipation.

Historically, where high speed and/or high power dissipation was a critical design requirement, expensive ceramic or metal can packages have been used, which generally exhibit lower parasitic capacitance, higher thermal conductivity and greater mechanical strength than plastic packages. Aside from a substantially increased cost over standard plastic packages, however, ceramic and metal packages have a further disadvantage of being bulkier than their plastic counterparts (i.e., larger in size), which is a detriment where circuit board real estate is scarce. Additionally, bonding wires, which connect the bond pads of the semiconductor device to the package pins, adds series inductance which severely degrades the high frequency performance of the device.

Driven by the need for smaller consumer products and lower manufacturing costs, there has been a trend to shrink die and package sizes of the circuit components. This is most evident, for example, in the cellular telephone market, which has been recently pushing operating frequencies into the gigahertz range while concurrently shrinking the product size to easily fit in a shirt pocket. Because integrated circuit technology has resulted in increased functionality, enabling more circuit elements to be fabricated on the same semiconductor die, more heat is generated per unit volume within the smaller package footprint. Higher clock frequencies have further challenged the heat dissipation and speed capability of conventional package designs.

Although some heat generated by the semiconductor die is conveyed to the outside of the device package through the mold compound, the primary heat flow paths for a standard leadframe package are through the package leads themselves (typically made of copper). Unfortunately, however, conventional package leads and bond wires add significant amounts of parasitic inductance to the circuit. Although the length of the bond wires may be less for smaller package arrangements, the parasitic inductance associated with these bond wires is still considerably significant at such frequencies, for example, in the gigahertz range. Therefore, high frequency performance remains substantially impaired. High-speed performance, high power dissipation and small package size represent conflicting design requirements. Thus far, conventional integrated circuit packaging technology has failed to concurrently fulfill these important characteristics.

There are other various problems associated with conventional packaging technologies. For example, dwindling printed circuit board space has pressured semiconductor manufacturers to produce components having a smaller footprint (i.e., external package dimensions). Furthermore, quality performance and reliability problems, and costly delays associated with offshore manufacturing (e.g., assembly and packaging), are additional concerns that prior art packaging technologies have failed to alleviate.

By focusing on only a single specific design problem, rather than addressing multiple problems simultaneously, prior art packaging technologies have exacerbated other equally crucial problems. Accordingly, there remains a need in the prior art to provide a semiconductor device chip integrated into a packaging arrangement, in combination, that, among other things, is capable of high frequency operation, that can more readily dissipate the heat generated by the integrated circuit, that is smaller in physical size, that utilizes conventional semiconductor fabrication technology and that has a relatively low manufacturing cost.

OBJECTS AND SUMMARY OF THE INVENTION

It is an object of the present invention to provide a semiconductor device that incorporates a semiconductor die and a package, monolithically fabricated together in a single silicon wafer matrix.

It is another object of the present invention to provide a semiconductor device having low package parasitic capacitance, thereby enabling high frequency (e.g., microwave) operation of the device.

It is yet another object of the present invention to provide a semiconductor device that has enhanced power dissipation capability.

It is a further object of the present invention to provide a semiconductor device having a footprint (i.e., external dimensions) essentially limited only by the active device junction region.

It is still a further object of the present invention to provide a semiconductor device that is fabricated using conventional photolithography technology, thus eliminating the need for offshore assembly and packaging.

In accordance with one form of the present invention, a complete surface mount semiconductor device is provided which incorporates at least one discrete device (e.g., a diode, transistor, etc.) and a package, monolithically fabricated together in a single semiconductor wafer matrix. The device/package configuration preferably includes at least one semiconductor component formed on an active surface of a semiconductor substrate and an insulative layer, bonded to or laminated with the active surface of the substrate. The semiconductor device of the present invention thus eliminates the assembly and packaging step associated with conventional IC packaging arrangements. Furthermore, the device of the present invention is preferably fabricated using conventional semiconductor process technology known in the art, thereby eliminating the need for expensive new equipment, modifications to existing equipment, or offshore manufacturing.

The semiconductor device of the present invention requires no leadframe or bonding wires, and therefore exhibits lower parasitic capacitance than conventional package arrangements. Furthermore, because the package is monolithically fabricated with the discrete device, the footprint of the packaged device is essentially limited only by the die size itself, which can be easily scaled downward as the process technology advances.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 5 is a cross-sectional view depicting a device etch fabrication process step of the semiconductor device shown in FIG. 1A, taken along line 3—3 of Figure 1A.

FIG. 6 is cross-sectional view depicting a glass fill fabrication process step of the semiconductor device shown in FIG. 1A, taken along line 3—3 of FIG. 1A.

DETAILED DESCRIPTION OF THE PREFERRED EMBODIMENTS

Figure 1A:
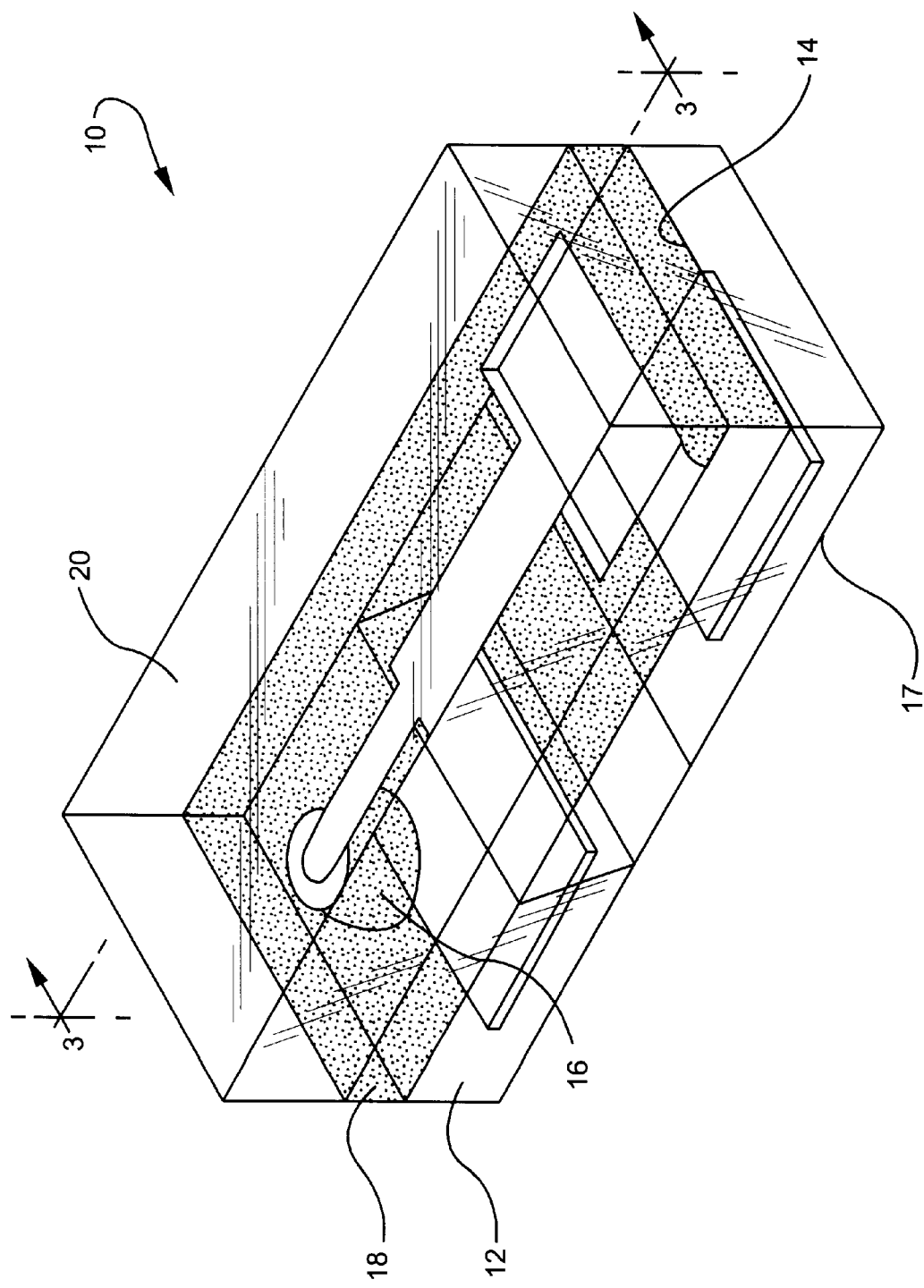
FIG. 1A is a top perspective view of a surface mount semiconductor device, formed in accordance with one embodiment of the present invention, with certain layers shown as transparent in order to reveal underlying layers of the device.
Figure 1B:
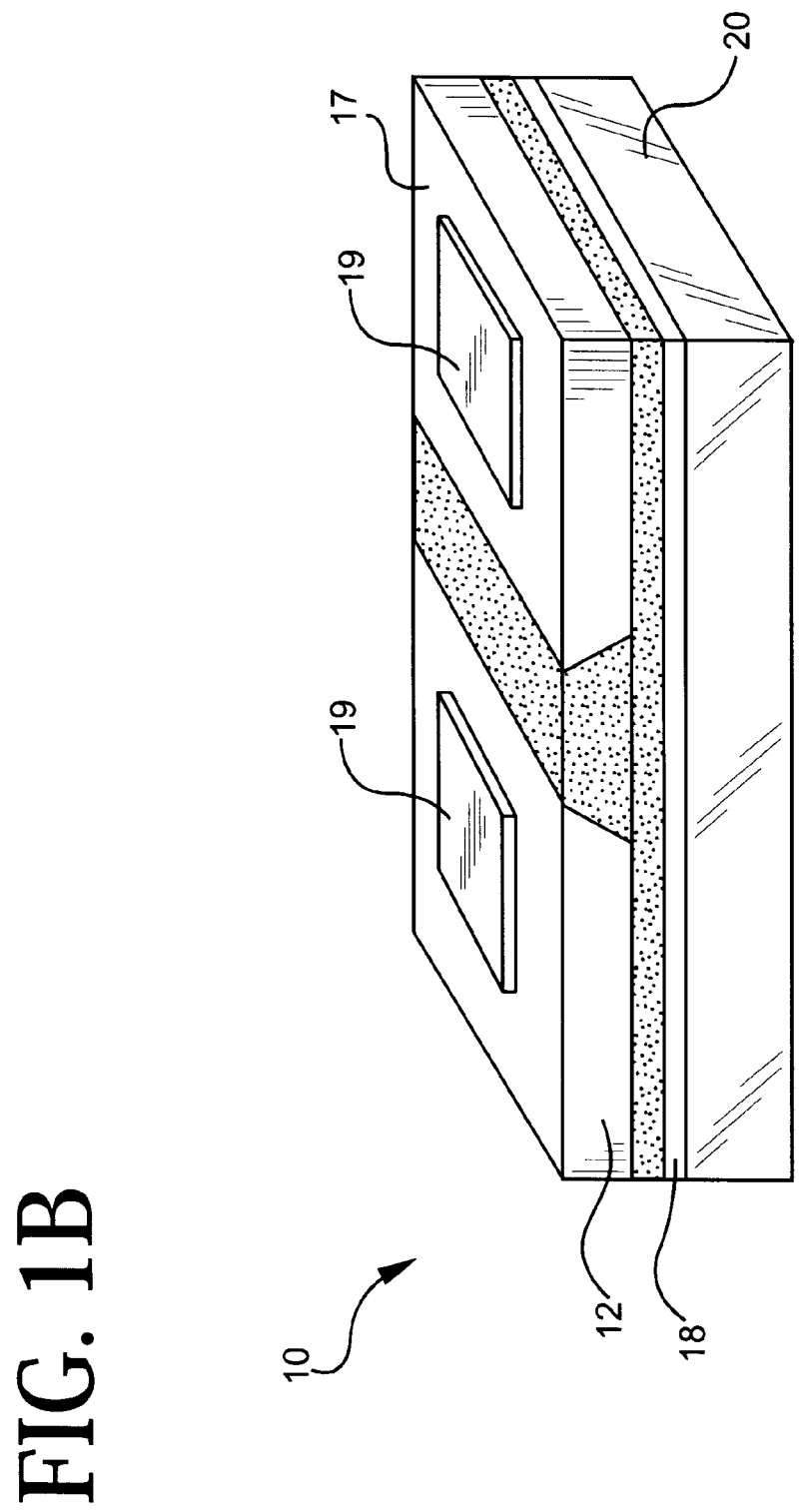
FIG. 1B is a perspective view of the bottom of the surface mount device shown in FIG. 1A.

FIGS. 1A and 1B generally illustrate a semiconductor device formed in accordance with one embodiment of the present invention. With reference to FIGS. 1A and 1B, the semiconductor device 10 of the present invention preferably includes a semiconductor substrate 12 having a first substantially planar external surface 14 (hereinafter designated as the main or active surface) on which at least one discrete semiconductor device 16 (e.g., a diode, transistor, etc.) is formed using a conventional photo lithographic fabrication process. An insulative layer or substrate 20 is preferably bonded to or lamented with the active surface 14 of the substrate 12. This insulative layer is preferably formed as a thin glass slide, approximately 200 $\mu$m in thickness. The glass slide 20 is preferably bonded to the active surface 14 of the semiconductor substrate 12 by depositing a coating or layer of epoxy 18 on at least a portion of the active surface 14 of the substrate 12, although other bonding means are contemplated. The epoxy 18 is subsequently cured, such as by heat, ultraviolet radiation, or other suitable means, depending on the type of epoxy employed, thereby forming a mechanical bond between the glass slide 20 and the semiconductor substrate 12.

With continued reference to FIGS. 1A and 1B, in order to provide electrical connection to the discrete device 16 formed on substrate 12, contacts 19 are preferably formed on a second substantially planar external surface 17 of the wafer (hereinafter designated as the back surface), which is opposite active surface 14. The contacts 19 are preferably formed of gold, although other suitable materials, as appreciated by those skilled in the art, may be used (e.g., aluminum, titanium, or platinum).

Figure 2:
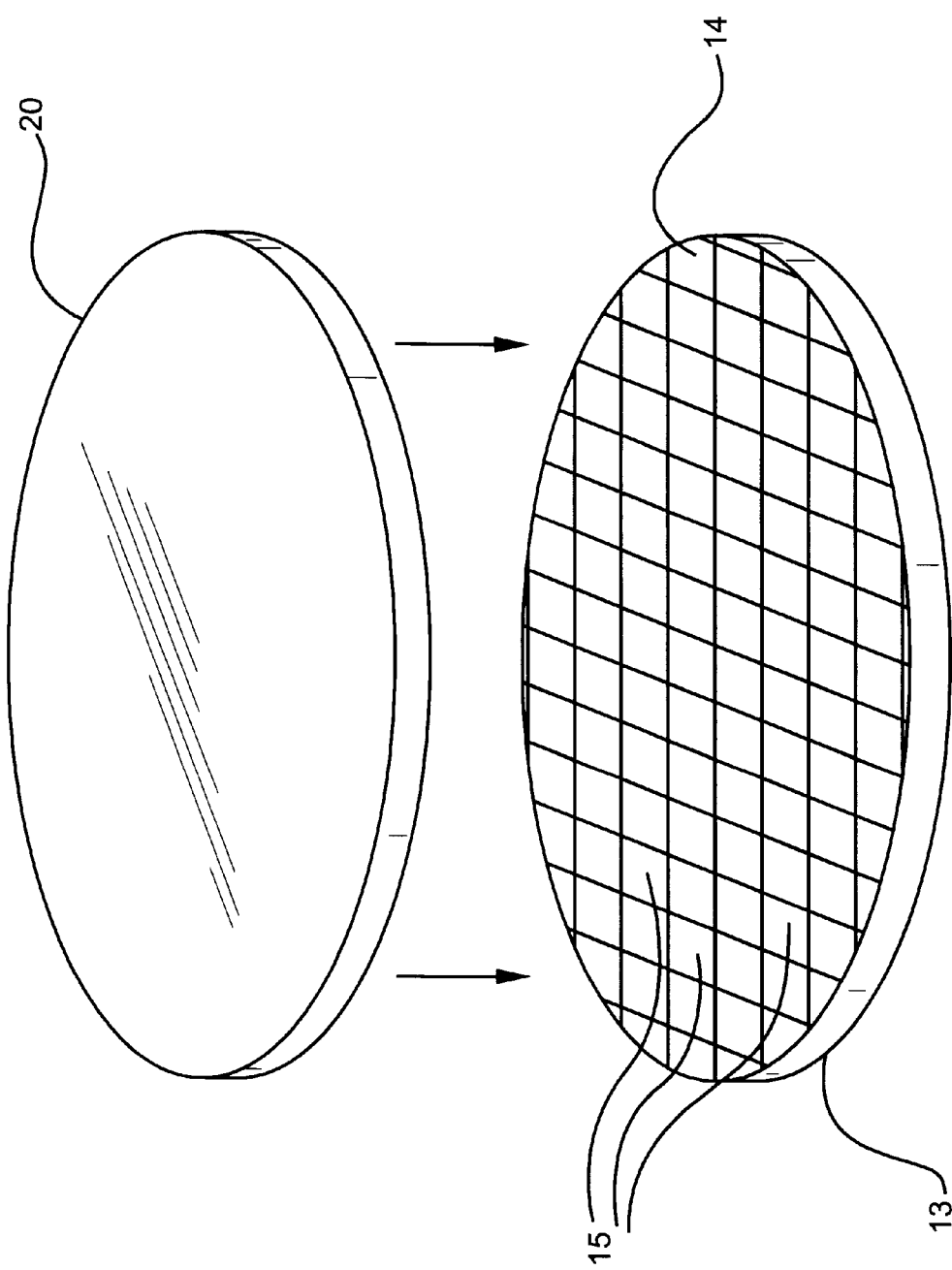
FIG. 2 is a top perspective view of a semiconductor wafer illustrating the placement of an insulative packaging layer on the surface of a semiconductor wafer having a plurality of integrated circuit die formed thereon, in accordance with one embodiment of the present invention.

As illustrated in FIG. 2, glass slide 20 is preferably bonded with a finished semiconductor wafer 13 comprising a plurality of monolithic circuit die 15 fabricated thereon using a standard photo lithographic process. It is preferred that glass slide 20 be sized and adapted to cover the entire wafer surface 14 in order to facilitate batch processing of the plurality of die 15. Alternatively, however, the present invention contemplates that the wafer 13 may be separated into a plurality of individual die 15 prior to bonding the glass slide 20 to the active surface 14 of the wafer 13. Furthermore, a plurality of glass slides may be selectively bonded to predetermined groups of die on the same wafer 13.

Referring again to FIGS. 1A and 1B, when bonded with the semiconductor substrate 12, glass slide 20 preferably functions to encapsulate the completed semiconductor die, thereby providing protection from external environmental attack (e.g., oxidation, moisture, scratching, etc.). This allows for conventional tape and reeling of completed devices and provides compatibility to currently used surface mount device assembly technologies. Additionally, glass slide 20 preferably provides mechanical support for the device 10. In this manner, glass slide 20, in combination with a completed semiconductor die, forms a unique packaging arrangement which is monolithically fabricated with the semiconductor component at the wafer level. Accordingly, the need for conventional assembly and packaging steps is thereby eliminated. Furthermore, because conventional wire bonding is not required, the device 10 of the present invention exhibits superior electrical performance (e.g., low parasitic capacitance, high power dissipation, high reliability, etc.), in comparison to standard prior art packaged devices, thereby making device 10 particularly well-suited for high frequency and/or high power applications.

FIGS. 3–13 illustrate an exemplary semiconductor process for fabricating one embodiment (a diode) of a monolithically packaged surface mount device in accordance with the present invention. The semiconductor device of the present invention incorporates a unique wafer-level packaging arrangement fabricated using standard photo lithographic techniques known in the art. A detailed discussion of a conventional photolithography fabrication process, suitable for use with the present invention, is provided in such texts as *Silicon Processing For the VLSI Era*, Stanley Wolf and Richard N. Tauber, Lattice Press, 1986, *CMOS Analog Circuit Design*, Phillip E. Allen and Douglas R. Holberg, Holt, Rinehart and Winston, 1987 and *Bipolar and MOS Analog Integrated Circuit Design*, Alan B. Grebene, John Wiley & Sons, 1984. These texts are incorporated herein by reference. Consequently, only a cursory discussion of the semiconductor fabrication process will be presented below, as necessary to more clearly describe the novel features and advantages of the present invention.

Figure 3:
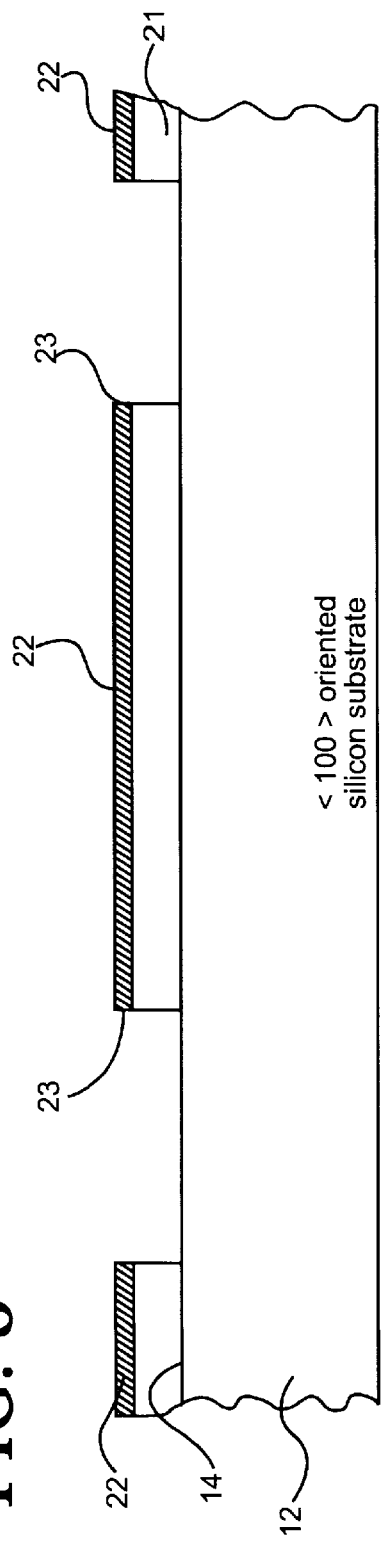
FIG. 3 is a cross-sectional view depicting the formation of isolation trench windows in a silicon nitride layer of a semiconductor device, in accordance with one embodiment of the present invention.

With particular reference to FIG. 3, the semiconductor substrate 12, in wafer form, is the starting material for the semiconductor fabrication process. Substrate 12 is preferably formed of a single-crystal silicon (Si) material. The silicon crystals are preferably sliced into wafers which are on the order of about 400 $\mu$m in thickness. This thickness, however, may vary depending upon, for example, the physical strength requirements of substrate 12. Since silicon is predominantly used as the starting wafer material, a description of the present invention will be presented herein below with specific reference to a conventional silicon monolithic fabrication process. It is to be appreciated by those skilled in the art, however, that substrate 12 may be similarly formed of other semiconductor materials, such as germanium (Ge) or gallium arsenide (GaAs).

The silicon crystals forming substrate 12 are preferably grown in a <100> crystal orientation (e.g., using a Czochralski process). During the initial silicon crystal growth, the <111> oriented crystal is easier to grow defect-free, and is thus somewhat less expensive, than the <100> crystal orientation. Additionally, the <111> crystal is less affected by surface contamination than the <100> crystal. For this reason, the <111> oriented crystal is typically used for most bipolar device substrates. However, for reasons explained below with reference to the device etch step of the fabrication process, a <100> oriented substrate is preferred.

When the silicon crystals comprising the substrate 12 are grown, they are preferably selectively doped with either a p-type impurity (e.g., boron, aluminum, gallium, etc.) or an n-type impurity (e.g., phosphorus, antimony, arsenic, etc.) to form a p- or n-substrate respectively. Furthermore, it is also contemplated that the silicon wafer may be doped to selectively create substrate regions of both resistivity types existing on the same wafer. The type of impurity (i.e., dopant) material used and the level of impurity concentration in the silicon substrate will primarily affect the electrical resistivity of substrate 12.

In FIGS. 3–13 there is shown a preferred process for forming a surface mount diode in accordance with the present invention. The formation of the diode is illustrated by way of example only, and is not intended to limit the present invention to such device. Rather, the present invention contemplates forming other semiconductor components and circuits (e.g., transistors, silicon-controlled rectifiers, logic gates, etc.), using conventional monolithic fabrication techniques known in the art, employing the packaging arrangement of the present invention, as described herein below with particular reference to the diode.

Figure 4:
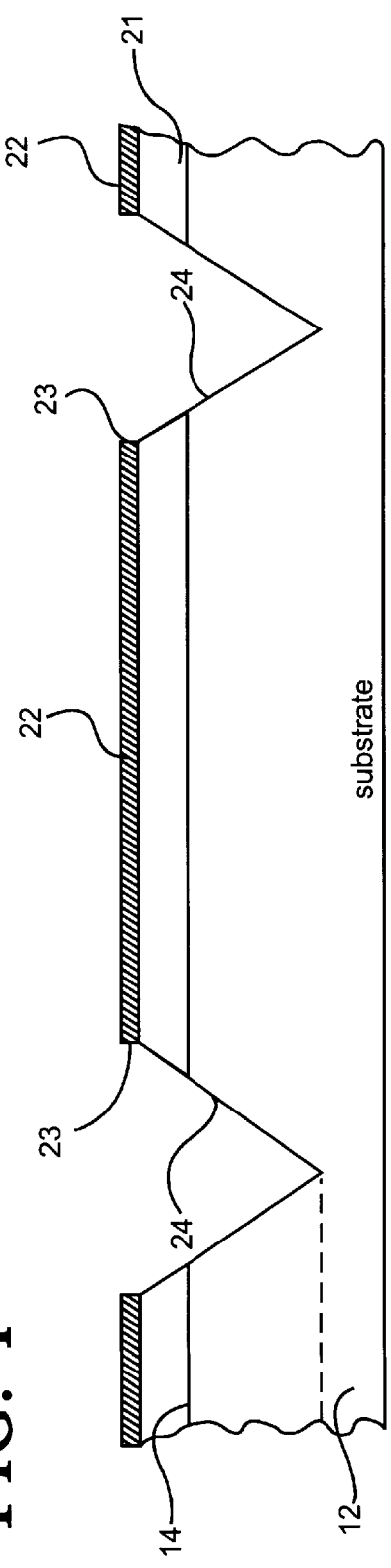
FIG. 4 is a cross-sectional view depicting the formation of isolation trenches in the substrate of the semiconductor device shown in FIG. 3.

As shown in FIGS. 3–5, after forming the various regions of desired resistivity levels on the surface 14 of substrate 12 which defines an active device (or devices), dielectric isolation trenches or streets 24 are preferably formed at least partially in, but not entirely through, substrate 12. First, a layer of silicon dioxide ($SiO_2$) 21 is preferably grown on the surface 14 of substrate 12. This silicon dioxide layer 21 may be formed to a desired thickness (designated $t_{ox}$) using either dry or wet techniques known in the art. For example, the silicon wafer may be oxidized by exposing the unpassivated surface 14 of the wafer to steam or dry oxygen at high temperatures, typically ranging from about 700 to 1100 degrees Celsius. The oxide layer 21 preferably forms an inert protective layer covering the surface of the silicon substrate 12. Aside from serving as a barrier to the diffusion of impurities into the silicon substrate 12, oxide layer 21 preferably provides an insulating surface over which metal interconnections may eventually be formed.

Additional silicon material may preferably be selectively deposited on oxide layer 21 or oxide layer 21 may be selectively etched away, using standard photolithography techniques known in the art, to create predefined patterned regions in the wafer. These predefined regions are preferably doped at various resistivity levels depending upon the type of device being fabricated (e.g., diode, transistor, etc.).

After the wafer surface 14 has been oxidized, a coating or layer 22 of silicon nitride ($Si_3N_4$) is preferably deposited on the active surface of the wafer by conventional deposition techniques, such as plasma or chemical vapor deposition, as appreciated by those skilled in the art. This silicon nitride layer 22 will preferably act as a masking layer, preventing the action of the potassium hydroxide (KOH) etchant solution (see below), thus protecting various regions of the silicon surface 14. Silicon nitride is more resistant to ionic contamination than silicon dioxide and is therefore preferred as a passivating layer for integrated circuit structures whose performance may be adversely effected by surface contamination. Additionally, silicon nitride has superior masking properties against doping impurities which can readily diffuse through the silicon dioxide layer. Isolation trench windows or openings 23 are preferably formed in silicon nitride layer 22 by standard photo lithographic techniques known in the art, thereby exposing active surface 14 of the wafer 12 in a predetermined grid pattern.

The exposed active wafer surface 14 is subsequently preferably etched in a potassium hydroxide (KOH) etchant solution. The potassium hydroxide solution preferably etches away the exposed silicon in a preferential manner; that is, the etch rate along the <100> planes of the silicon crystal substrate is approximately 100 times faster than the etch rate along the <111> planes. This preferential etching results in the formation of a plurality of isolation trenches 24 in the wafer surface 14 having substantially V-shaped sidewalls 26 (see FIG. 5). The depth of the isolation trench 24 is preferably only a small fraction of the total wafer thickness. It is to be appreciated that, although a potassium hydroxide etchant is preferred for the device etch process step, other suitable solutions, such as, for example, a hydrogen fluoride (HF) etchant solution, may be similarly employed.

With reference now to FIG. 6, isolation trench 24 is preferably filled with a passivation glass filler 28 such that an external surface 29 of the filled isolation trench 24 is substantially planar (i.e., level) with the active wafer surface 14. This passivation glass filler 28 preferably provides mechanical stability for the completed semiconductor device and, additionally, provides electrical isolation between regions of differing resistivity; for example, between the anode region 46 and cathode region 44 of the completed device 10 (see FIG. 13). The material used for the passivation glass filler 28 is preferably comprised of zinc-borosilicate. Alternatively, it is contemplated that isolation trench 24 may be filled, for example, by selectively growing a layer of silicon dioxide over the surface 14 of substrate 12 so as to essentially fill isolation trench 24.

Figure 7:
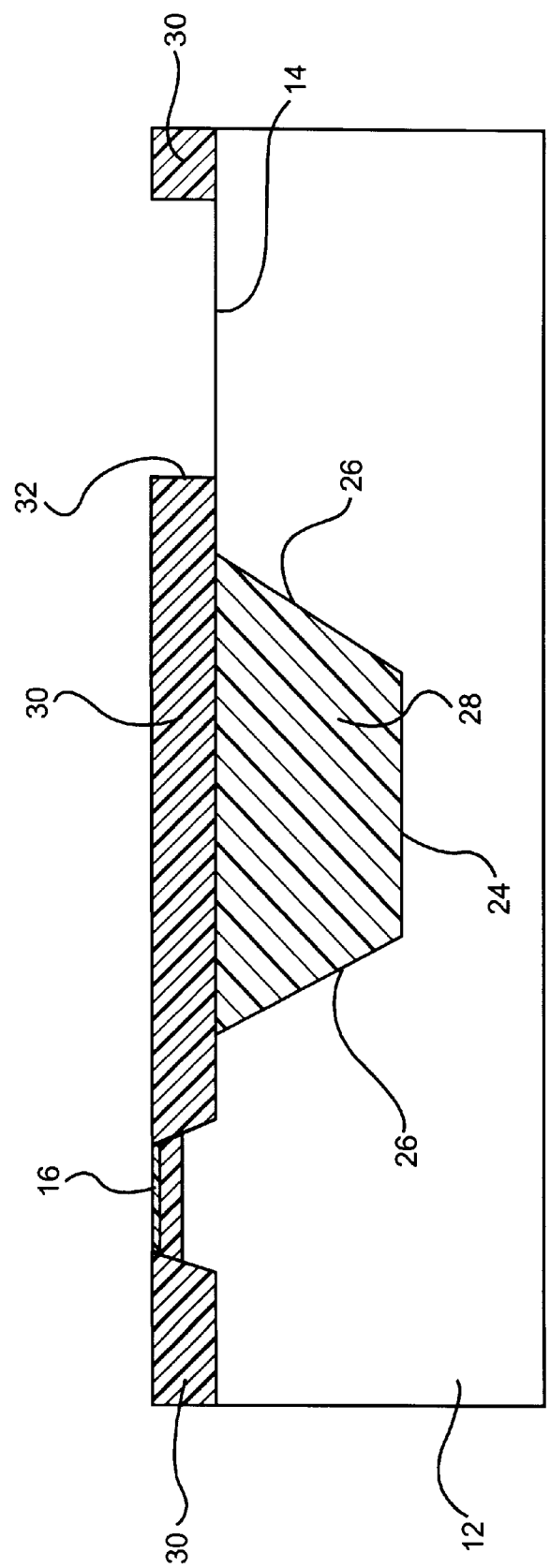
FIG. 7 is cross-sectional view depicting a photolithography glass fabrication process step of the semiconductor device shown in FIG. 1A, taken along line 3—3 of FIG. 1A.

As shown in FIG. 7, a passivation layer 30 is preferably subsequently deposited over the active surface 14 of the silicon wafer (i.e., substrate 12). Passivation layer 30 is preferably formed of a mixture comprising photoresist and zinc-borosilicate, although other suitable materials, for example silicon dioxide, may be used, as appreciated by those skilled in the art. Passivation layer 30 is preferably patterned, using conventional photolithography techniques, to selectively provide windows 32 in passivation layer 30 for future metal connection areas of the device.

Figure 8:
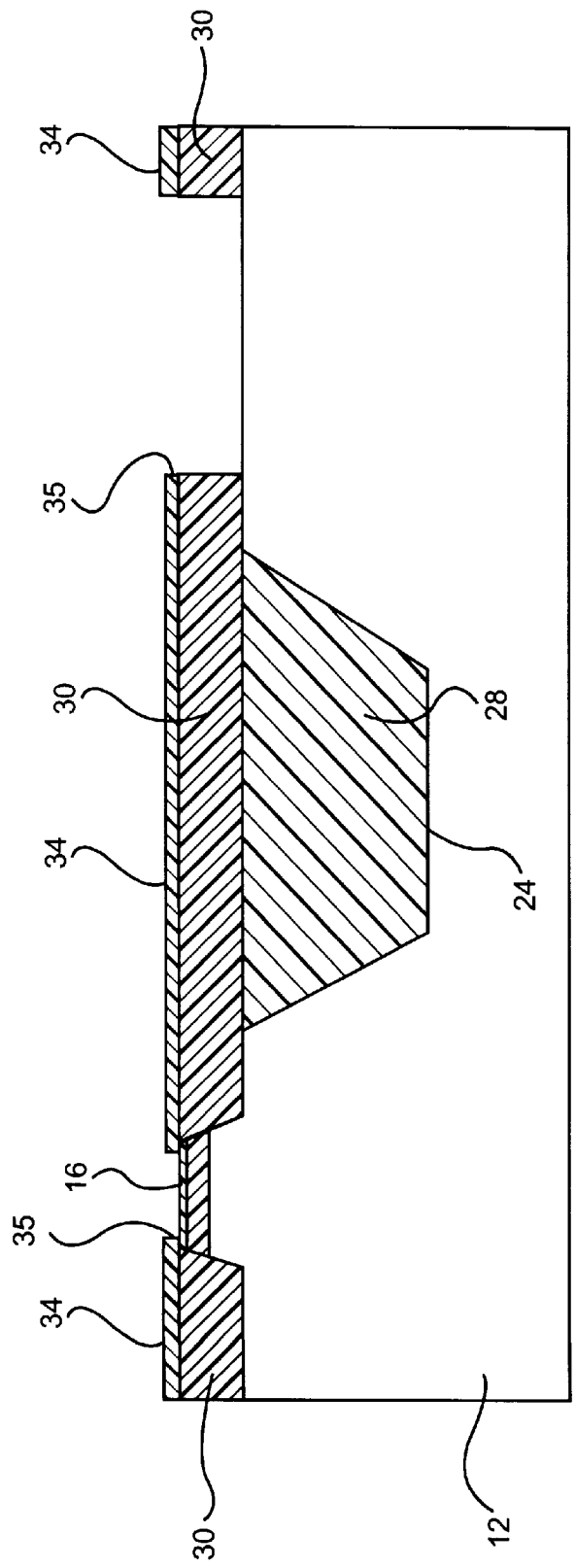
FIG. 8 is cross-sectional view depicting a chemical vapor deposition fabrication process step of the semiconductor device shown in FIG. 1A, taken along line 3—3 of FIG. 1A.

Referring to FIG. 8, it is often advantageous to form an inert dielectric coating or layer 34 over passivation layer 30 in order to protect the passivation layer 30 from chemical or environmental attack during future processing steps. This coating 34 may be formed as a thin layer of silicon dioxide, preferably pyrolytically deposited over the surface of the wafer. One preferred deposition technique is conventional chemical vapor deposition (CVD). An advantage to using CVD for the deposition process step is that the silicon wafer is maintained at a relatively low temperature (e.g., about 400 degrees Celsius) and typically at atmospheric pressures. It is to be appreciated by those skilled in the art, however, that other deposition techniques, including vacuum deposition and sputtering, may also be employed.

Following the oxide deposition step, a masking step is preferably performed to selectively pattern the metal connection areas of the device. During the masking operation, a mask pattern (indicating the desired metal connection points) is transferred to the wafer surface, preferably by standard contact photo lithographic methods. A layer or coating of photosensitive material (i.e., photoresist or simply resist) is preferably initially deposited on the wafer surface to be masked. After exposing the silicon wafer to ultraviolet light for a predetermined length of time, the photoresist not covered by the opaque portions of the mask preferably harden as a result of this exposure. The unexposed portions of the photoresist can then be washed away.

It is to be understood by those skilled in the art, that various exposure techniques, suitable for use with the present invention, may be employed for transferring the mask pattern to the wafer surface. Although standard direct contact photo lithographic methods are preferred, other conventional exposure techniques, including projection printing, direct step on wafer (DSW) and electron beam techniques, may be similarly utilized.

With continued reference to FIG. 8, as a consequence of the masking step, the desired pattern to be etched through oxide layer 34 is transferred to the wafer surface in the form of a hardened etch-resistant photoresist pattern. The wafer is then placed in contact with a conventional etchant solution, such as hydrofluoric acid (HF), or an equivalent thereof, thereby forming metal contact windows 35 through the oxide layer 34.

Figure 9:
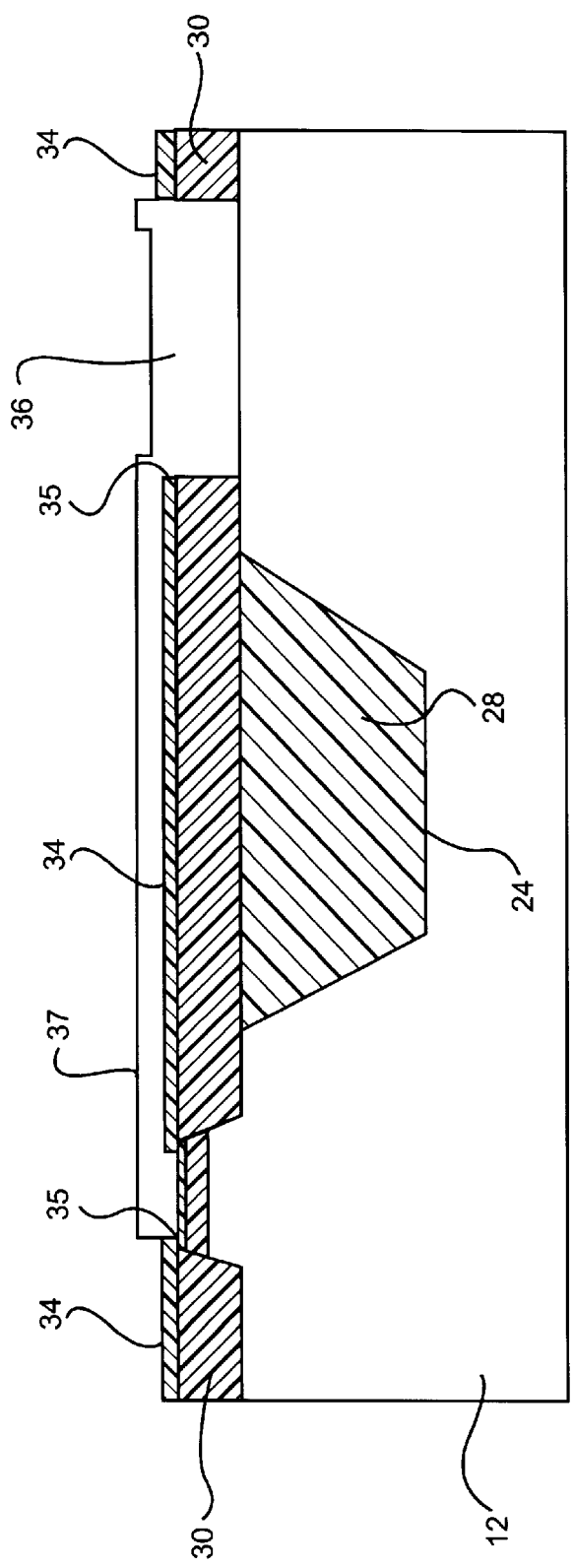
FIG. 9 is cross-sectional view depicting a metal deposition fabrication process step of the semiconductor device shown in FIG. 1A, taken along line 3—3 of FIG. 1A.

FIG. 9 illustrates the metal deposition step of the fabrication process, which will now be discussed. In conventional monolithic integrated circuit fabrication, electrical connection to the semiconductor regions can preferably be formed by depositing a thin metal film of high electrical conductivity over contact windows 35. The deposition of interconnection metal and metal contacts on the wafer is typically the final step in the planar process. Aluminum is the most commonly used interconnection metal; however, other metals may be utilized, such as, for example, palladium, platinum, or titanium. Aluminum, palladium or platinum may be readily alloyed into the silicon substrate to form ohmic contacts by a short heat treatment in an inert atmosphere. For example, in the case of aluminum, the heat treatment duration is preferably approximately ten (10) minutes at about 500 degrees Celsius. The type of metal selected will be dependent upon the particular device being fabricated, as well as the related material resistivity and type utilized, as appreciated by those skilled in the art.

As shown in FIG. 9, an ohmic contact 36 is preferably formed to the anode region of the semiconductor device. Following the formation of ohmic contact 36 to the anode, additional metal may be deposited and patterned in order to form the beam 37 which contacts the device anode to the cathode.

Figure 10:
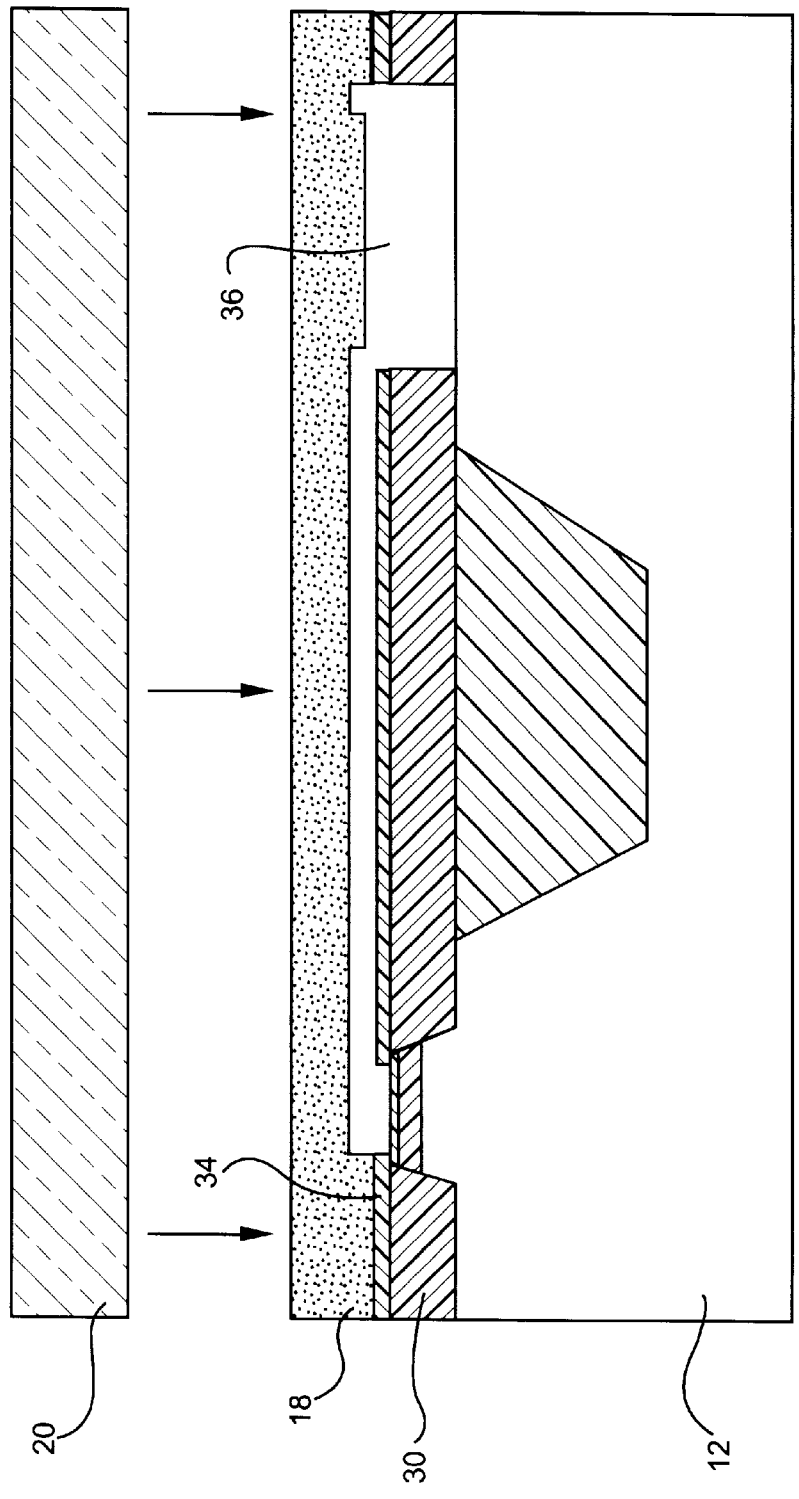
FIG. 10 is cross-sectional view depicting an encapsulant epoxy deposition fabrication process step of the semiconductor device shown in FIG. 1A, taken along line 3—3 of FIG. 1A.
Figure 11:
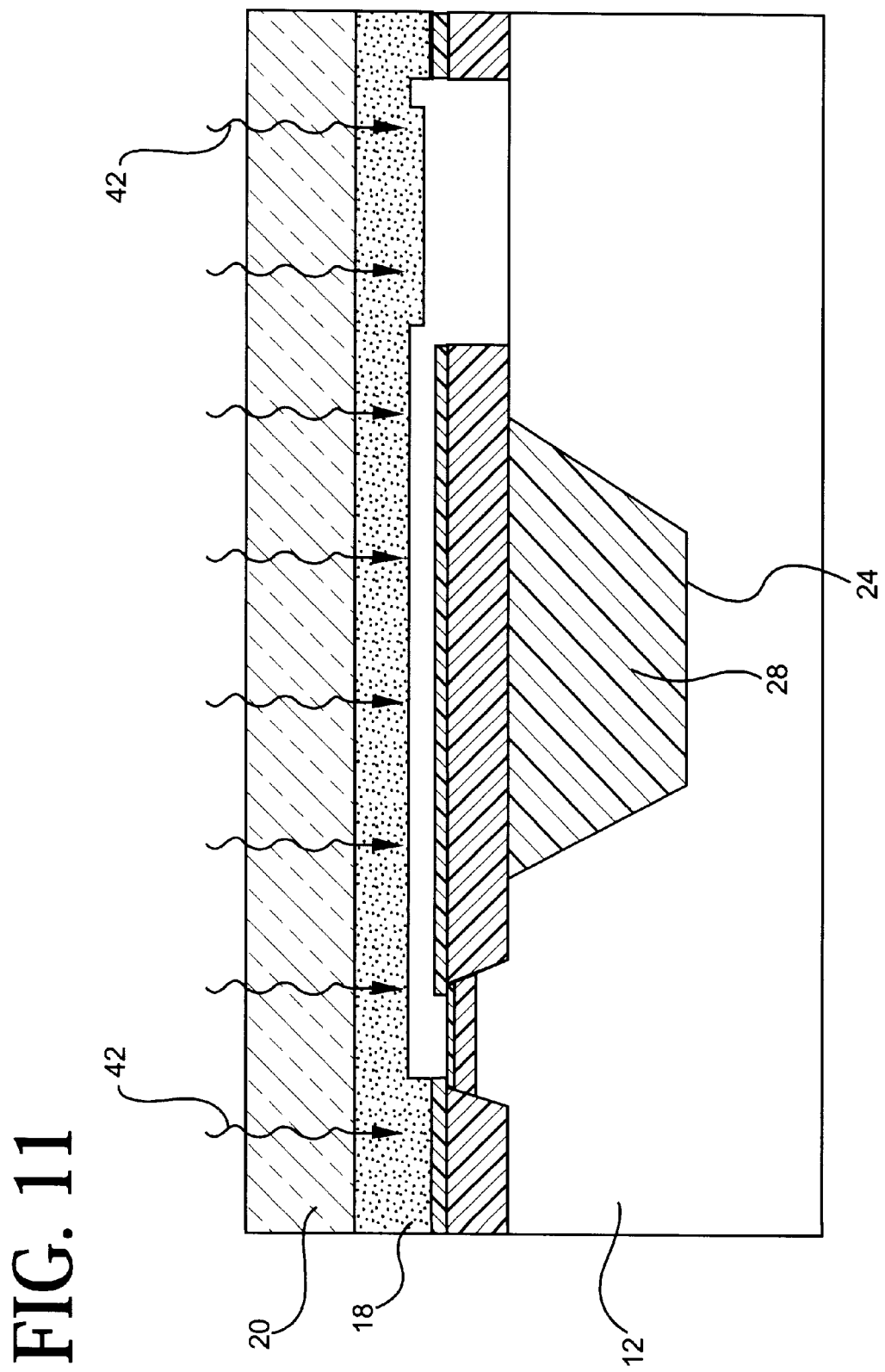
FIG. 11 is cross-sectional view depicting a glass slide bonding fabrication process step of the semiconductor device shown in FIG. 1A, taken along line 3—3 of FIG. 1A.

FIGS. 10 and 11 illustrate subsequent steps of the semiconductor fabrication process. Referring to FIG. 10, a bonding layer 18 is preferably deposited on the active surface of the semiconductor wafer 12. The bonding material comprising bonding layer 18 must be non-conductive and preferably does not noticeably impair the power dissipation capability or the high frequency performance of the device. Preferably, an ultraviolet-(UV-) sensitive encapsulant epoxy is used to bond the glass slide 20 to the wafer surface. Using a UV-sensitive epoxy as the bonding material facilitates the curing step. Alternatively, the present invention also contemplates using other types of epoxy, such as, for example, a heat-sensitive epoxy which may be cured by exposing the epoxy coating to high temperature. Exposure of the wafer to high temperatures, however, may be undesirable in that certain impurities may be diffused into the semiconductor material, thus possibly adversely affecting the electrical characteristics of the device.

The insulative layer 20 is preferably a standard transparent glass slide comprised of potash, soda and zinc-borosilicate, although or other suitable materials having similar properties may be used, as known by those skilled in the art. Referring again to FIG. 2, glass slide 20 preferably covers the entire active surface 14 of the wafer 13, such that the plurality of completed semiconductor die 15, which are formed on the wafer 13, are encapsulated by glass layer 20 at essentially the same time.

With particular reference to FIG. 11, it is preferred that glass slide 20 be transparent to radiation in at least the ultraviolet portion of the frequency spectrum, thereby enabling the ultraviolet-sensitive epoxy 18 to be cured by passing ultraviolet radiation 42, for example, from an external UV light source, directly through glass slide 20, once glass slide 20 is properly positioned on the wafer. Furthermore, glass slide 20 may preferably be transparent to visible light as well, thus allowing visible inspection and alignment of individual die through the glass side 20 of the device. Alternatively, if a UV-sensitive epoxy is not employed, it may be desirable to form glass slide 20 from a material which substantially blocks the passage of visible and UV light. This would provide added security by preventing visible inspection of the underlying semiconductor die and would additionally provide protection for circuits or components which are adversely effected by light.

The thickness of glass slide 20 is not absolutely critical. Since its primary function is to provide protection and mechanical support for the completed device, the thickness of glass slide 20 may be varied, depending upon the physical requirements of the device. Preferably, the thickness of the glass slide 20 will be on the order of about 225 $\mu$m.

Figure 12:
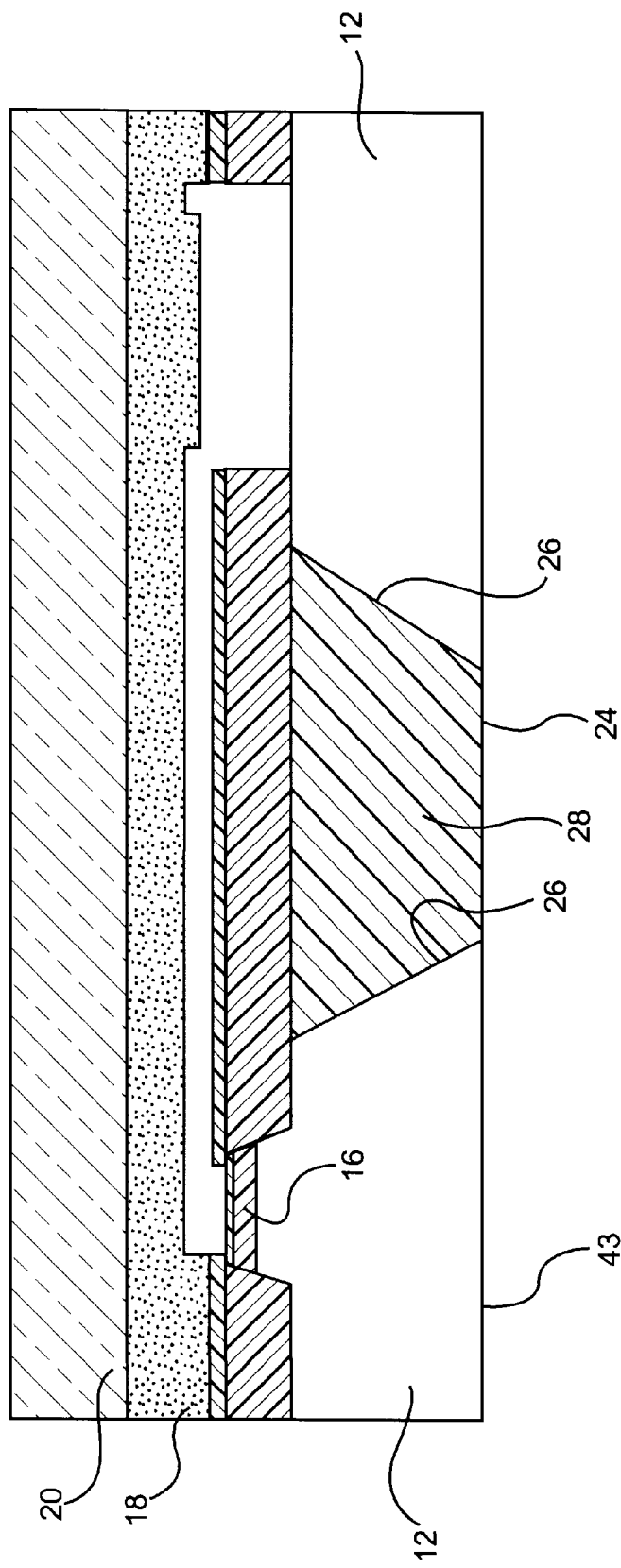
FIG. 12 is cross-sectional view depicting a thindown fabrication process step of the semiconductor device shown in FIG. 1A, taken along line 3—3 of FIG. 1A.

As shown in FIG. 12, once glass slide 20 is bonded to the semiconductor wafer, the wafer is preferably thinned down from the back surface 43 (i.e., silicon side) of the wafer. The back surface 43 of the wafer is preferably ground down, such as by conventional backlapping or similar means, until the patterned isolation grid, comprised of a plurality of isolation streets 24, is exposed on the back surface 43 of the wafer. As a result of the backlapping process, a plurality of isolated pockets 12 are formed in the semiconductor substrate, separated from each other by the width of the corresponding isolation street 24. It is to be appreciated that, although the thickness of the wafer is reduced as a result of the backlapping procedure, glass slide 20, in combination with bonding layer 18, preferably provides enhanced mechanical structure and stability for the device, thereby compensating for the reduced substrate thickness. Therefore, thinning down the wafer results in virtually no loss in structural integrity of the completed semiconductor device.

Figure 13:
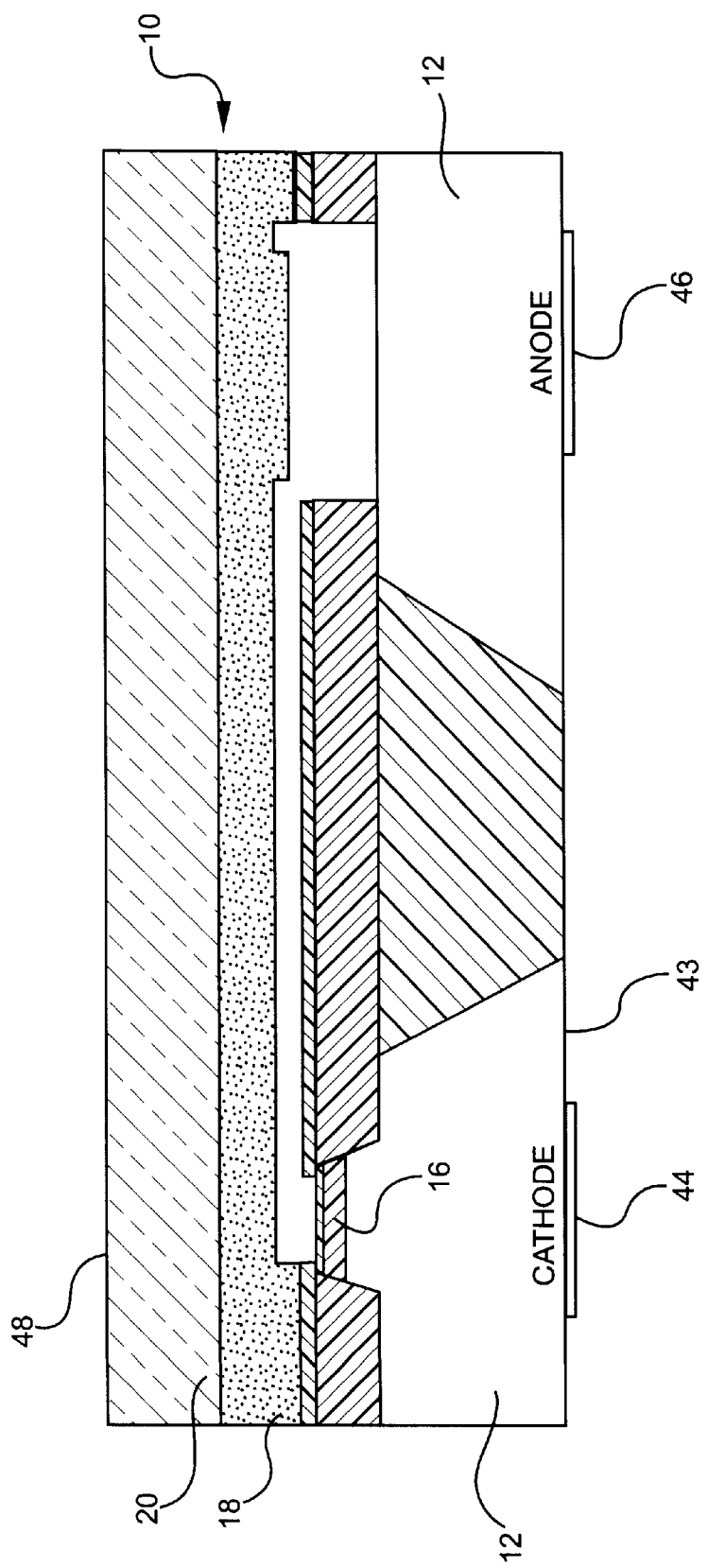
FIG. 13 is cross-sectional view depicting a contact formation fabrication process step of the semiconductor device shown in FIG. 1A, taken along line 3—3 of FIG. 1A.

With reference now to FIG. 13, following the backlapping process, electrically conductive contacts 44, 46 are preferably formed on the back surface 43 of the glass/silicon semiconductor wafer matrix, representing the cathode terminal and the anode terminal of the device 10 respectively. An indicator mark, such as, for example, a plus sign ("+") or a minus sign ("−"), may be additionally deposited on the glass side 48 of the device 10 in order to aid in distinguishing, from the glass side 48, the cathode terminal from the anode terminal of the device 10. Due to the close proximity of the discrete device 16 to the heat dissipating cathode contact 44, the power handling capability of the semiconductor device 10 of the present invention is superior to existing IC/package configurations.

The metal forming the device contacts 44, 46 may preferably be formed of gold (Au), although various other electrically conductive materials which are suitable for use with the present invention (e.g., aluminum, titanium, or platinum) may be similarly used, as appreciated by those skilled in the art. The deposition of the contact metal may be performed by any standard metal deposition techniques known in the art.

After completion of the fabrication process, the semiconductor wafer is preferably subsequently separated into a plurality of individually packaged die. The die may be separated in accordance with conventional wafer dicing techniques known by those skilled in the art, such as, for example, laser scribing or by employing a wafer dicing saw. Additionally, the scribe regions separating the completed devices may be substantially thinned down such that individual die can be separated by conventional etching. Although it is preferred that the dicing step be performed as a final stage in the semiconductor fabrication process (in order to facilitate batch manufacturing), it is to be appreciated by those skilled in the art, that the dicing procedure may alternatively be preformed prior to bonding the glass slide to the wafer. In this manner, each die must be individually bonded with a corresponding glass slide.

It is to be appreciated that the fabrication techniques of the present invention, as described herein above and shown in the accompanying Figures, relate specifically to the formation of a diode. A diode was chosen by way of example only, in order to facilitate the explanation of the present invention, due to the simplicity of its structure. The monolithically fabricated packaging arrangement of the present invention, however, may be similarly employed to form various other semiconductor components, in accordance with the present invention described herein.

The surface mount semiconductor device of the present invention incorporates at least one discrete device (e.g., a diode, transistor, etc.) and a package, monolithically fabricated together in a single semiconductor wafer matrix. The semiconductor device of the present invention requires no leadframe or bonding wires, and therefore parasitic capacitance is substantially low. Additionally, the close proximity of the discrete device to a heat dissipating contact increases the power dissipation of the semiconductor device. Thus the device of the present invention exhibits superior high frequency performance and power handling capability. Furthermore, because the package is monolithically fabricated with the semiconductor component, the footprint of the packaged device is essentially limited only by the die size itself, which can be easily scaled downward with advancements in process technology. The device of the present invention is fabricated using conventional semiconductor process technology known in the art, without offshore assembly, thereby keeping manufacturing costs low.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A method of forming a surface mount semiconductor device having a monolithically fabricated package, comprising the steps of:

forming at least one discrete device on a semiconductor substrate having an active surface and a back surface opposite the active surface, the active and back surfaces being substantially planar, the at least one discrete device being formed on the active surface of the substrate;

depositing an ultraviolet-curable adhesive layer on at least a portion of the active surface;

positioning an ultraviolet-transparent insulative layer on the adhesive layer;

curing the adhesive layer bv passing ultraviolet radiation through the insulative layer; whereby a bond is formed between the insulative layer and the active surface of the substrate via the adhesive layer; and depositing electrically conductive material on the back surface of the substrate, the conductive material forming at least one contact which is operatively connected to the at least one discrete device.

2. A method of forming a plurality of surface mount semiconductor devices, each device having a monolithically fabricated package, comprising the steps of:

forming a plurality of semiconductor die on a semiconductor wafer having an active surface and a back surface opposite the active surface, the active and back surfaces being substantially planar, the semiconductor die being formed on the active surface of the wafer;

depositing an ultraviolet-curable adhesive layer on at least a portion of the active surface;

positioning an ultraviolet-transparent insulative layer on the adhesive layer;

bonding the insulative layer to the active surface of the wafer by passing ultraviolet radiation through the insulative layer to cure the adhesive layer, thereby encapsulating the plurality of semiconductor die;

forming a plurality of contacts on the back surface of the wafer, the contacts being operatively connected to the semiconductor die; and separating the plurality of semiconductor die into individually packaged semiconductor devices.

3. A method of forming a surface mount diode having a monolithically fabricated package, comprising the steps of:

forming a diode junction on a semiconductor substrate having an active surface and a back surface opposite the active surface, the active and back surfaces being substantially planar, the diode junction being formed on the active surface of the substrate;

forming an isolation trench in the active surface of the substrate;

filling the isolation trench with an insulative filler such that the filler is substantially planar with the active surface of the substrate;

depositing an ultraviolet-curable adhesive layer on at least a portion of the active surface of the substrate;

positioning an ultraviolet-transparent insulative layer on the adhesive layer;

bonding the insulative layer to the active surface of the substrate by passing ultraviolet radiation through the insulative layer to cure the adhesive layer, the insulative layer encapsulating the diode junction;

thinning down the substrate from the back surface until at least a portion of the isolation trench appears through the back surface, the isolation trench defining a cathode region and an anode region in the substrate; and forming first and second contacts on the back surface of the substrate, the first contact being electrically connected to the cathode region and the second contact being electrically connected to the anode region.

4. A method according to claim 3, further comprising the step of:

forming an indicator mark on the insulative layer, the indicator mark distinguishing the first contact from the second contact.

\* \* \* \* \*